US 8,704,927 B2

(12) United States Patent
Mabuchi

(10) Patent No.: US 8,704,927 B2
(45) Date of Patent: Apr. 22, 2014

(54) SOLID-STATE IMAGING APPARATUS, DRIVING METHOD, AND CAMERA

(75) Inventor: Keiji Mabuchi, Kanagawa (JP)

(73) Assignee: Sony Corporation (JP)

( * ) Notice: Subject to any disclaimer, the term of this patent is extended or adjusted under 35 U.S.C. 154(b) by 309 days.

(21) Appl. No.: 12/967,764

(22) Filed: Dec. 14, 2010

(65) Prior Publication Data

US 2011/0149104 A1    Jun. 23, 2011

(30) Foreign Application Priority Data

Dec. 21, 2009 (JP) ................................ 2009-289509

(51) Int. Cl.
*H04N 3/14* (2006.01)

(52) U.S. Cl.
USPC ........................................................ 348/308

(58) Field of Classification Search
CPC ..... H04N 5/335; H04N 3/1518; H04N 5/155; H01L 27/14643; H01L 51/0545
USPC ........... 348/294, 306, 308; 250/208.1; 257/40
See application file for complete search history.

(56) References Cited

U.S. PATENT DOCUMENTS

| 4,912,560 | A | * | 3/1990 | Osawa et al. | 348/313 |
| 6,667,768 | B1 | * | 12/2003 | Fossum | 348/308 |
| 7,116,365 | B1 | * | 10/2006 | Ueno et al. | 348/308 |
| 7,217,983 | B2 | * | 5/2007 | Suzuki | 257/444 |
| 7,515,187 | B2 | * | 4/2009 | Suzuki | 348/296 |
| 7,973,843 | B2 | * | 7/2011 | Andersson et al. | 348/296 |
| 2006/0128050 | A1 | | 6/2006 | Lee | |
| 2009/0153716 | A1 | * | 6/2009 | Ota | 348/308 |
| 2009/0166787 | A1 | | 7/2009 | Park | |
| 2010/0002110 | A1 | * | 1/2010 | Ota | 348/294 |

FOREIGN PATENT DOCUMENTS

| JP | H01-252078 | 10/1989 |
| JP | H03-167973 | 7/1991 |
| JP | 11-239299 | 8/1999 |
| JP | 2004-011590 | 1/2004 |
| JP | 2004-140149 | 5/2004 |
| JP | 2006-120922 | 5/2006 |
| JP | 2006-120922 | 11/2006 |
| JP | 2008-258474 | 10/2008 |
| JP | 2009-049870 | 3/2009 |
| JP | 2010-016593 | 1/2010 |

OTHER PUBLICATIONS

European Search Report issued on Apr. 4, 2012, in connection with counterpart EP Application No. 10 195 489.9.
Official Action (no English translation available) for Japanese Patent Application No. 2009-289509 mailed Jun. 11, 2013, 6 pages.

* cited by examiner

*Primary Examiner* — Aung S Moe
*Assistant Examiner* — Chriss Yoder, III
(74) *Attorney, Agent, or Firm* — Sheridan Ross P.C.

(57) ABSTRACT

An imaging device includes a photoelectric conversion unit, a contact region, and an accumulation region. The contact region is configured to receive a charge from the photoelectric conversion unit. The accumulation region is configured to store the charge from the contact region. The imaging device is configured to selectively inject a charge into the contact region.

31 Claims, 17 Drawing Sheets

PRior Art

SOLID-STATE IMAGING APPARATUS, DRIVING METHOD, AND CAMERA

RELATED APPLICATION DATA

The present application claims priority to Japanese Patent Application JP 2009-289509 filed in the Japan Patent Office on Dec. 21, 2009, which is incorporated herein by reference in its entirety to the extent permitted by law.

BACKGROUND OF THE INVENTION

The present invention relates to a solid-state imaging apparatus having a photoelectric conversion film, a driving method, and a camera.

Japanese Unexamined Patent Application Publication No. 2006-120922 describes configuration in which a photoelectric conversion film is applied to a CCD solid-state imaging apparatus.

FIG. 1 illustrates the imaging apparatus described in Japanese Unexamined Patent Application Publication No. 2006-120922.

A solid-state imaging apparatus 1 includes a p-well 3 on a semiconductor substrate 2, the p-well 3 including a charge accumulation unit 4, a barrier unit 5, a contact unit 6, and a charge transfer unit 7.

An insulating film 8 is provided on the p-well 3. On the insulating film 8, a photoelectric conversion film 9, an upper electrode 10, and a lower electrode 11 are provided. The lower electrode 11 and the contact unit 6 are connected via a contact 12 provided through the insulating film 8.

In the solid-state imaging apparatus 1, electrons generated by photoelectric conversion at the photoelectric conversion film 9 are accumulated in the charge accumulation unit 4.

The photoelectric conversion film 9 and the charge accumulation unit 4 are not directly connected; the barrier unit 5 is provided therebetween to overflow the barrier and guide the electrons to the charge accumulation unit 4.

The advantages of such configuration are as follows:

The electric potential of the lower electrode 11 in the photoelectric conversion film 9 equals the electric potential of the barrier unit 5.

This electric potential does not change even when a charge is accumulated in the charge accumulation unit 4.

As a result, the electrical field across the photoelectric conversion film 9 does not change depending on the signal.

Moreover, the linearity of the signal is good.

In this configuration, the contact unit 6 is separated from the charge accumulation unit 4. Thus, the electric potential of the contact unit 6 can be low. The electric potential of the charge accumulation unit 4 should be high for photoelectric accumulation.

As a result, the dark currents generated at the contact unit 6 can be reduced.

The solid-state imaging apparatus described in Japanese Unexamined Patent Application Publication No. 2006-120922 is a CCD type apparatus. With a MOS type solid-state imaging apparatus, images during the exposure period are not synchronized, causing moving subjects to be distorted.

Japanese Unexamined Patent Application Publication No. 2004-140149 describes a solid-state imaging apparatus including a photodiode that has a discharge transistor to synchronize images during the exposure period.

FIG. 2 illustrates a solid-state imaging apparatus described in Japanese Unexamined Patent Application Publication No. 2004-140149.

This solid-state imaging apparatus 20 includes a transfer transistor 21, an amplifier transistor 22, a selecting transistor 23, a reset transistor 24, a discharge transistor 25, and photodiode (PD) 26.

In such a case, the charge of the PD 26 is transferred to a floating diffusion (FD) in all pixels simultaneously, and the charge photoelectrically converted at the PD 26 while waiting for the signal to be read out one row at a time is discarded at a power supply Vdd via the discharge transistor 25.

Similar types of solid-state imaging apparatuses are also described in Japanese Unexamined Patent Applications Publication Nos. 11-239299, 2004-11590, 2009-49870, and 2008-258474.

When a solid-state imaging apparatus having a photoelectric conversion film and a barrier unit, as described in Japanese Unexamined Patent Application Publication No. 2006-120922, is modified into a MOS type solid-state imaging apparatus, synchronicity may be achieved in a screen by providing a discharge transistor, such as that described in Japanese Unexamined Patent Application Publication No. 2004-140149.

However, the inventors have recognized that there is still a problem. This problem will be discussed below.

Although not prior art, FIG. 3 illustrates the solid-state imaging apparatus of Japanese Unexamined Patent Application Publication No. 2006-120922, which is modified in a particular manner to be a MOS type solid-state imaging apparatus and further including a discharge transistor 13.

Photons that are generated at the photoelectric conversion film during the exposure period overflow to the accumulation unit by passing through the barrier unit, which is an electric potential barrier.

After the exposure period, the discharge transistor 13 is turned on, and the photons are discarded at the drain (A) of discharge transistor 13 so that the signals from the charge accumulation unit 4 are not damaged.

During this period, the electric potential of a contact unit (D) 6 should be higher than that of the barrier unit 5.

Then, the discharge transistor 13 is turned off before entering the next exposure period. However, since the electric potential of the contact unit (D) 6 is higher than that of the barrier unit 5, the electrons first entering the contact unit (D) 6 from the photoelectric conversion film 9 during the exposure period do not pass through the barrier unit 5 and are not accumulated in the charge accumulation unit 4.

As a result, the linearity of the signals is degraded.

SUMMARY OF THE INVENTION

Disclosed herein are one or more inventions that are capable of improving the linearity of signals when operation enters global shutter mode.

In an embodiment, a solid-state imaging apparatus includes a pixel unit and a driving unit. The pixel unit includes a matrix of pixels, which are configured to convert light into an electric signal. The driving unit is configured to drive the pixel unit. Each pixel includes a photoelectric conversion film, an injection unit, an accumulation unit, and a barrier unit. The photoelectric conversion film is configured to carry out photoelectric conversion. The injection unit is configured to inject a charge generated at the photoelectric conversion film to a semiconductor substrate. The accumulation unit is configured to accumulate the charge generated at the photoelectric conversion film. The accumulation unit is disposed in the semiconductor substrate. The barrier unit provides an electric potential barrier between the photoelectric conversion film and the accumulation unit. The pixel unit selectively injects the charge to the injection unit of the pixel.

In an embodiment, a method of driving a solid-state imaging apparatus includes selectively injecting a charge to an injection unit of each of the pixels. The solid state apparatus, which may be driven by the method, includes a pixel unit including a matrix of pixels, which are configured to convert light to an electric signal. The solid state apparatus includes a driving unit to drive the pixel unit. Each of the pixels includes a photoelectric conversion film, an injection unit, an accumulation unit, and a barrier unit. The photoelectric conversion film is configured to carry out photoelectric conversion. The injection unit is configured to inject a charge generated at the photoelectric conversion film to a semiconductor substrate. The accumulation unit is configured to accumulate the charge generated at the photoelectric conversion film. The accumulation unit is disposed in the semiconductor substrate. The barrier unit is configured to provide an electric potential barrier between the photoelectric conversion film and the accumulation unit. The pixel unit is configured to selectively inject a charge to the injection unit of the pixel.

In an embodiment, a camera includes a solid-state imaging apparatus, an optical system, and a signal processing circuit. The solid-state imaging apparatus is configured to receive light from a first substrate surface of a substrate. The optical system is configured to guide incident light to the first substrate surface of the solid-state imaging apparatus. The signal processing circuit is configured to process an output signal from the solid-state imaging apparatus. The solid-state imaging apparatus includes a pixel unit and a driving unit. The pixel unit includes a matrix of pixels converting light to an electric signal. The driving unit is configured to drive the pixel unit. Each of the pixels include a photoelectric conversion film, an injection unit, an accumulation unit, and a barrier unit. The photoelectric conversion film is configured to carry out photoelectric conversion. The injection unit is configured to inject a charge generated at the photoelectric conversion film into a semiconductor substrate. The accumulation unit is configured to accumulate the charge generated at the photoelectric conversion film. The accumulation unit is disposed in the semiconductor substrate. The barrier unit provides an electric potential barrier between the photoelectric conversion film and the accumulation unit. The pixel unit is configured to selectively inject a charge into the injection unit of the pixel.

In an embodiment, an imaging device includes a photoelectric conversion unit, a contact region, a barrier region, and an accumulation region. The contact region is configured to receive a charge from the photoelectric conversion unit. The barrier region is a region in which the charge passes from the contact region to the accumulation region, where the charge is stored. The imaging device is configured to selectively inject a charge into the contact region.

In an embodiment, an electronic apparatus includes an optical system and an imaging device. The imaging device is configured to receive incident light from the optical system. The imaging device has a plurality of pixels. Each pixel includes a photoelectric conversion unit, a contact region, an accumulation region, and a barrier region. The contact region is configured to receive a charge from the photoelectric conversion unit. The accumulation region is configured to store the charge. The barrier region is a region via which the charge passes from the contact region to the accumulation region. The circuit is configured to control the imaging device such that a charge is selectively injected into the contact region.

In an embodiment, a method for controlling an imaging device is disclosed. The imaging device may include (a) a photoelectric conversion unit, (b) a contact region to receive a charge from the photoelectric conversion unit, (c) an accumulation region to store the charge, and (d) a barrier region via which the charge passes from the contact region to the accumulation region. The method includes controlling the imaging device by selectively injecting a charge into the contact region.

In an embodiment, a method for manufacturing an imaging device having a pixel includes forming a photoelectric conversion unit, forming a contact region, and forming an accumulation region. The contact region is configured to receive a charge from the photoelectric conversion unit. The accumulation region is configured to store the charge. The method further includes providing a control circuit, which is configured to selectively inject a charge into the contact region.

According to embodiments of the present invention, the linearity of signals when operation enters global shutter mode can be improved.

DESCRIPTION OF THE PRESENTLY PREFERRED EMBODIMENTS

Embodiments of the present invention will be described below with reference to the drawings.

Descriptions will be presented in the following order:
1. Outline of solid-state imaging apparatus;
2. First embodiment of a pixel;
3. Second embodiment of a pixel;
4. Third embodiment of a pixel; and
5. Camera.

1. Outline of Solid-State Imaging Apparatus

Figure 1:
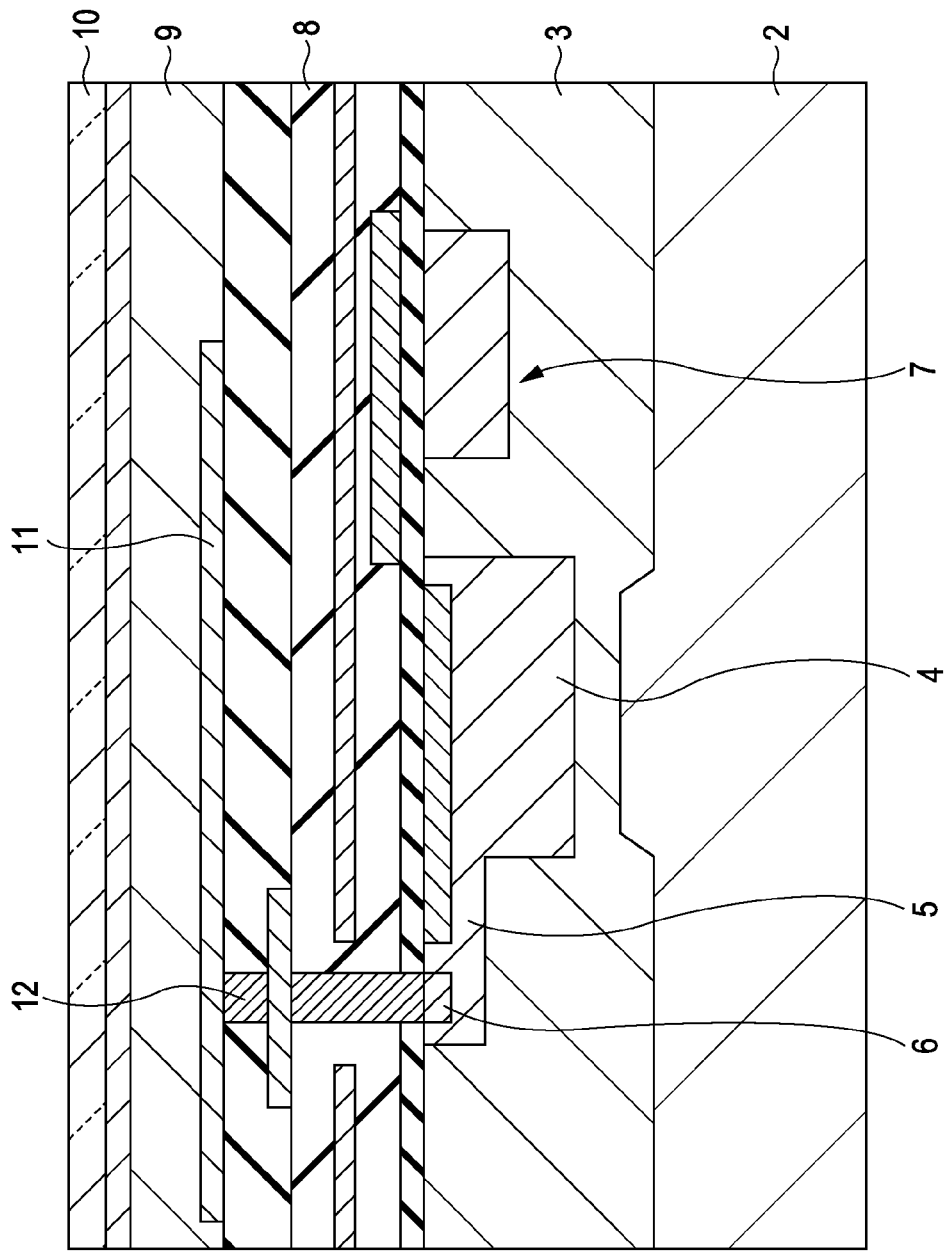
FIG. 1 illustrates a solid-state imaging apparatus described in Japanese Unexamined Patent Application Publication No. 2006-120922.
Figure 2:
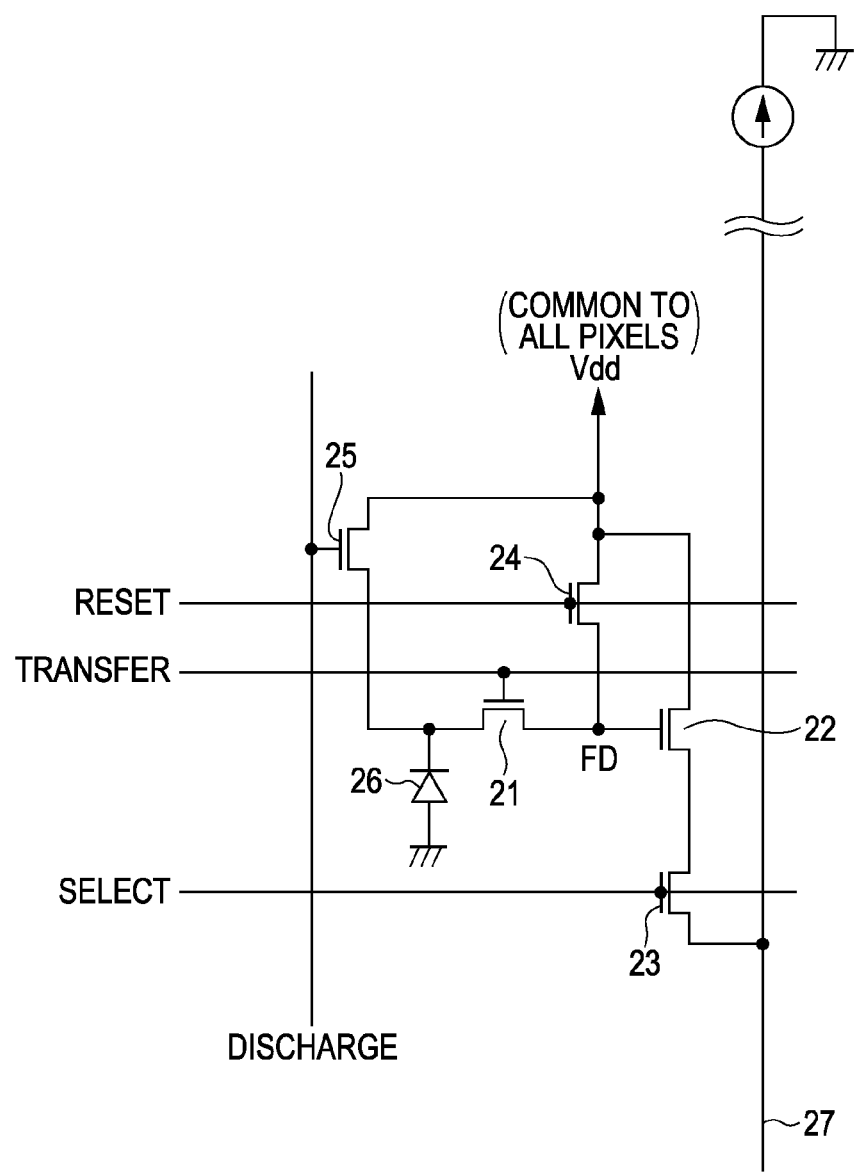
FIG. 2 illustrates a solid-state imaging apparatus described in Japanese Unexamined Patent Application Publication No. 2004-140149.
Figure 3:
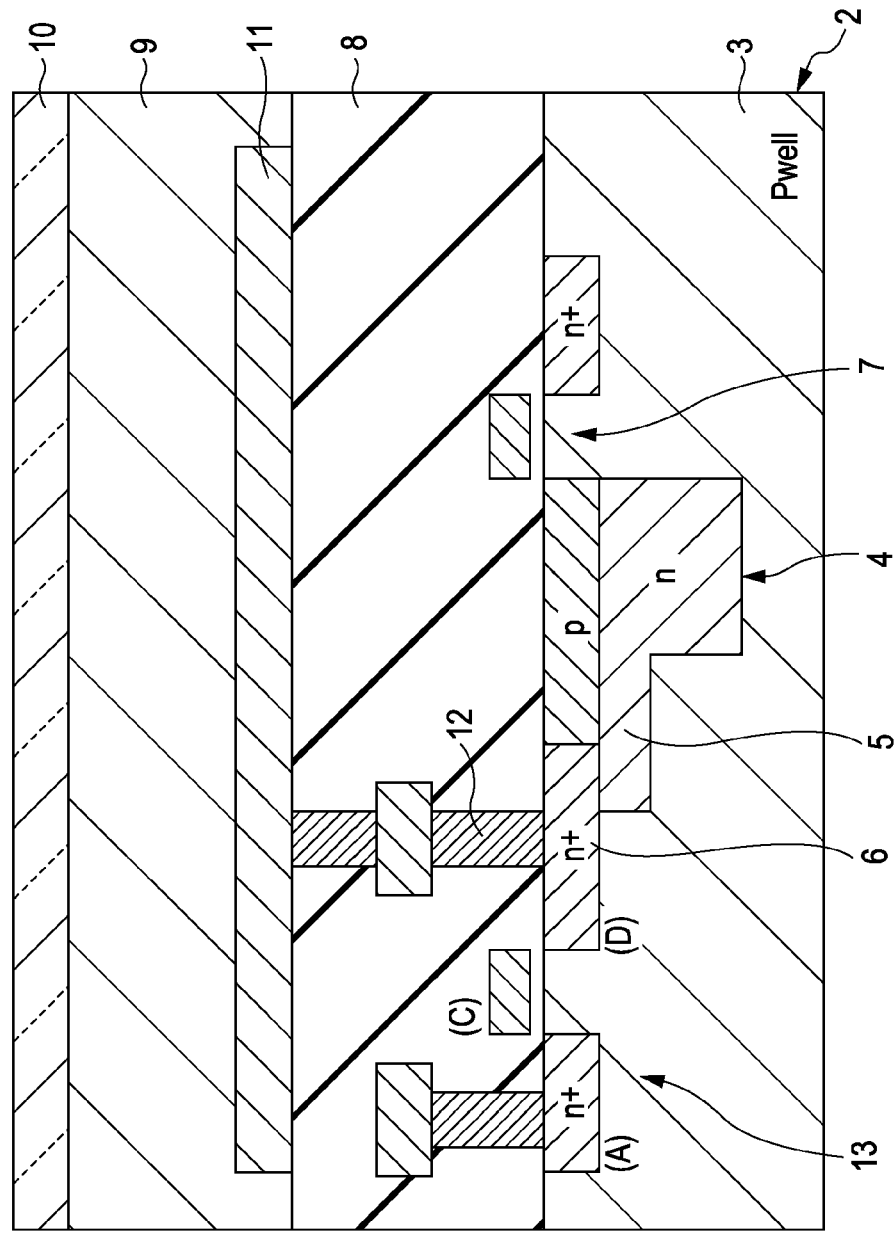
FIG. 3 illustrates a configuration example of a solid-state imaging apparatus having a photoelectric conversion film, as described in Japanese Unexamined Patent Application Publication No. 2006-120922, modified into a MOS type solid-state imaging apparatus.
Figure 4:
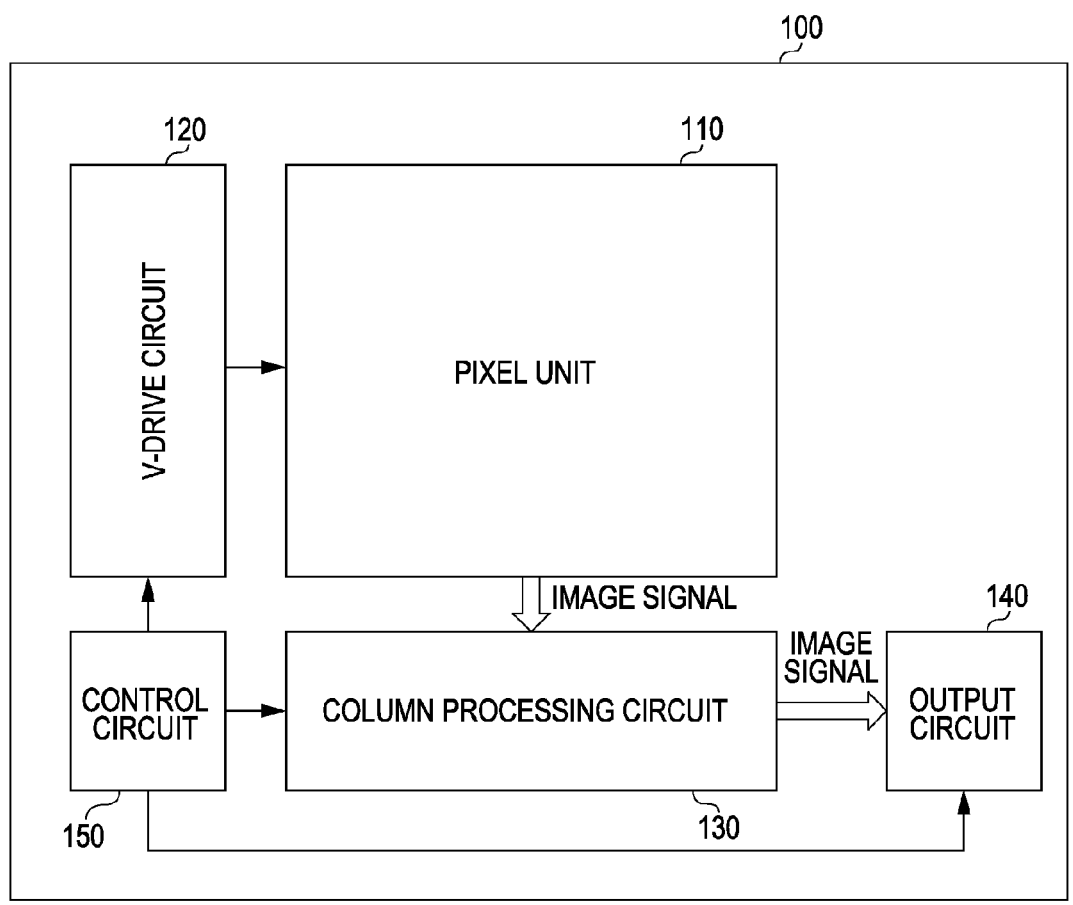
FIG. 4 is a block diagram illustrating, in outline, the configuration of a solid-state imaging apparatus according to an embodiment.

FIG. 4 is a block diagram illustrating, in outline, the configuration of a solid-state imaging apparatus 100 according to an embodiment.

As illustrated in FIG. 4, the solid-state imaging apparatus 100 includes a pixel unit 110, which is a sensing unit, a vertical drive circuit 120, which is a driving unit, a column processing circuit 130, an output circuit 140, and a control circuit 150.

As described below, a plurality of pixels 200, which each converts incident light into an electrical signal, is disposed in a matrix in the pixel unit 110.

The vertical drive circuit 120 drives the pixels 200 in the pixel unit 110.

The column processing circuit 130 receives image signals from the pixels and carries out variation compensation and AD conversion.

The output circuit 140 receives image signals from the column processing circuit 130 and outputs the signals to an external device after carrying out gain adjustment and damage correction to the signals.

The control circuit 150 sends control signals to the vertical drive circuit 120, the column processing circuit 130, and the output circuit 140 to control operation.

Detailed configuration and operation of each individual pixel according to this embodiment will be described below.

2. First Embodiment of Pixel

Figure 5:
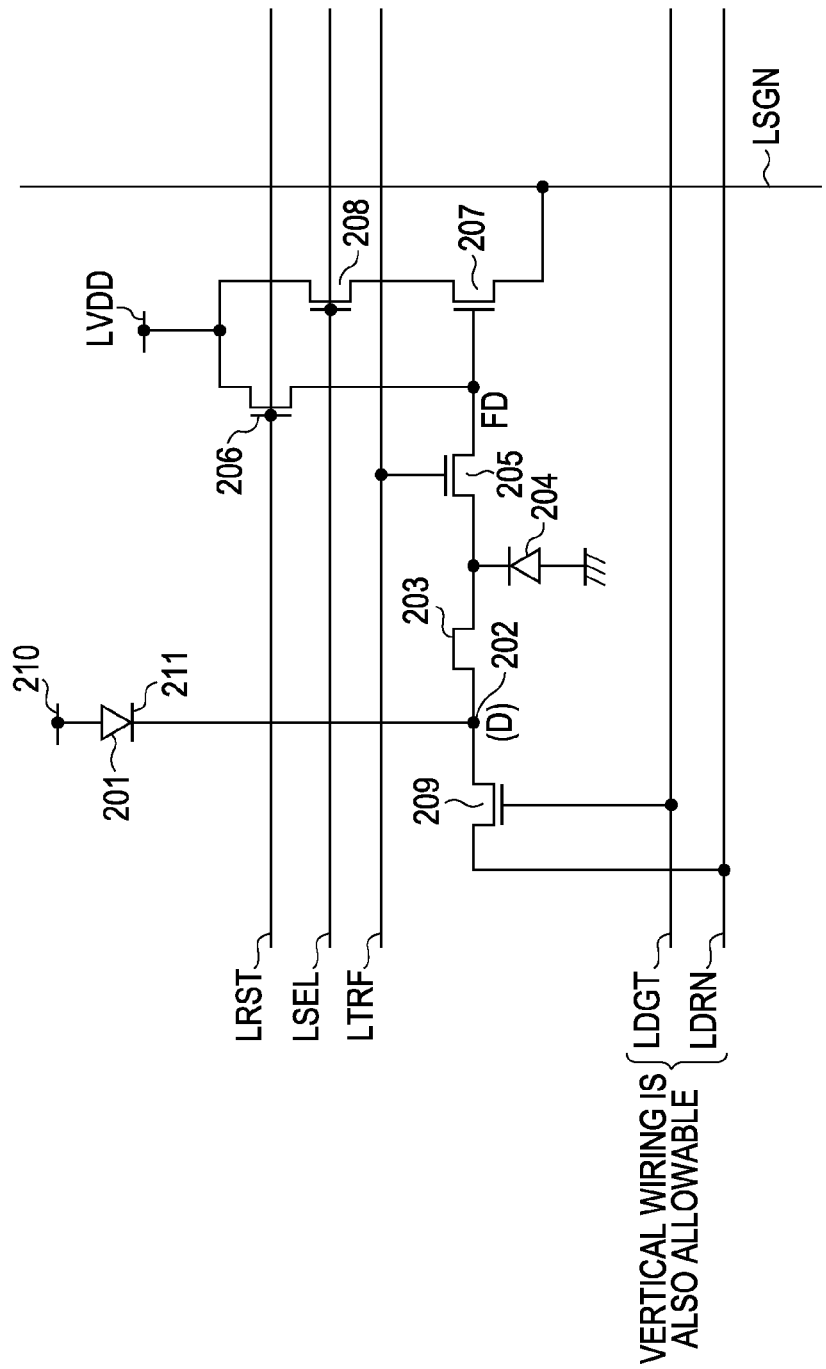
FIG. 5 is a circuit diagram illustrating a pixel according to a first embodiment of the present invention.

FIG. 5 is a circuit diagram illustrating a pixel according to a first embodiment of the present invention.

Figure 6:
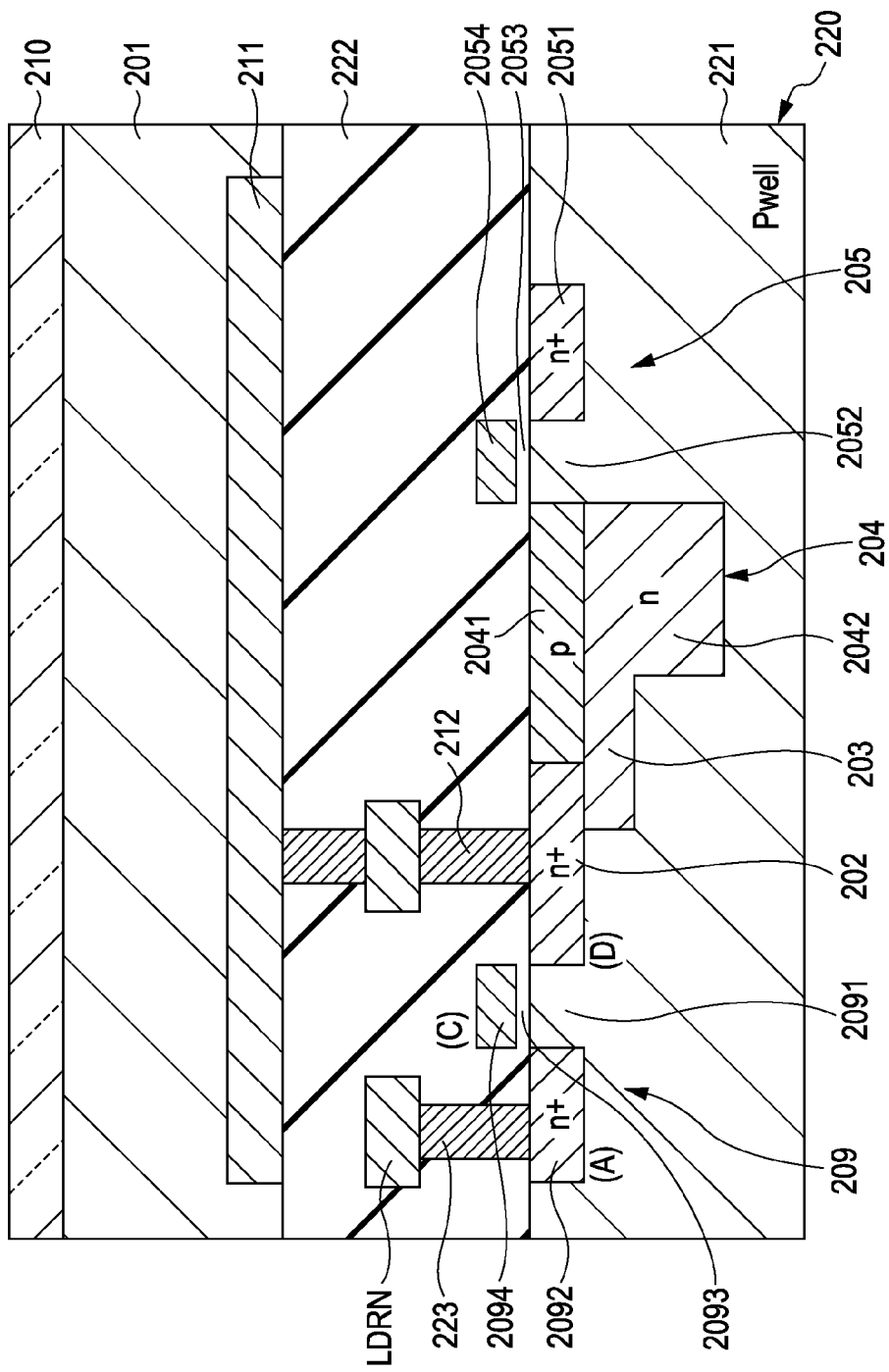
FIG. 6 is simplified partial sectional view illustrating, in outline, the pixel according to the first embodiment of the present invention.

FIG. 6 is a simplified partial sectional view illustrating, in outline, the pixel according to the first embodiment of the present invention.

Each pixel 200 may include a photoelectric conversion film 201, a contact unit 202, which is an injection unit, a barrier unit 203, an accumulation unit 204, a transfer transistor 205, a reset transistor 206, an amplifier transistor 207, a selecting transistor 208, and a discharge transistor 209.

One end of the photoelectric conversion film 201 is connected to an upper electrode 210, and the other end is connected to a lower electrode 211. The lower electrode 211 is connected to a contact unit 202 in a lower layer via a contact 212.

A charge generated at the photoelectric conversion film 201 is injected into the contact unit 202.

The contact unit 202 is connected to the accumulation unit 204 via the barrier unit 203.

The transfer transistor 205 is connected to the accumulation unit 204 and a floating diffusion FD (hereinafter may also be simply referred to as "FD"), which is an output node, and receives a transfer signal TRG, which is a control signal, at its gate (transfer gate) via a transfer control line LTRF.

In this way, the transfer transistor 205 transfers the charge (in this case, electrons) accumulated in the accumulation unit 204 to the floating diffusion FD.

The reset transistor 206 is connected to both a power supply line LVDD and the floating diffusion FD and receives a reset signal RST, which is a control signal, at its gate via a reset control line LRST.

In this way, the reset transistor 206 resets the electric potential of the floating diffusion FD to equal the electric potential of the power supply line LVDD.

The gate of the amplifier transistor 207 is connected to the floating diffusion FD. The source of the amplifier transistor 207 is connected to a vertical signal line LSGN. The drain of the amplifier transistor 207 is connected to the source of the selecting transistor 208 and the drain of the selecting transistor 208 is connected to the power supply line LVDD to constitute a constant current source and a source follower outside the pixel unit.

A selecting signal SEL, which is a control signal corresponding to an address signal, is sent to the gate of the selecting transistor 208 via a selecting control line LSEL to turn on the selecting transistor 208.

Upon turning on the selecting transistor 208, the amplifier transistor 207 outputs a voltage corresponding to the electric potential of the floating diffusion FD to the vertical signal line LSGN. The voltage output from each pixel is sent to the column processing circuit 130 via the vertical signal line LSGN.

Such operation is carried out simultaneously for all pixels in one row since the gates of, for example, the transfer transistors 205, the reset transistors 206, and the selecting transistors 208 are connected in row units.

The source of the discharge transistor 209 is the contact unit 202; the drain of the discharge transistor 209 is connected to a discharge drain line LDRN; and the gate of the discharge transistor 209 is connected to a discharge gate line LDGT.

The discharge drain line LDRN and the discharge gate line LDGT are driven by the vertical drive circuit 120; the discharge transistor 209 stays ON while maintaining its initial state; and initialization in which the charge is injected from the drain to the contact unit 202 is carried out.

In this embodiment, the gate and drain of the discharge transistor 209 are horizontally wired such that pixels in the same row are shared. Instead, however, the discharge transistor 209 may be vertically wired such that the pixels in the same column are shared.

The reset control line LRST, the transfer control line LTRF, the selecting control line LSEL, the discharge drain line LDRN, and the discharge gate line LDGT are wired in groups of row units of the pixel arrays to the pixel unit 110.

M represents the number of control lines. For example, a set of "M" control lines may include the following five control lines: LRST, LTRF, LSEL, LDRN, and LDGT.

The reset control line LRST, the transfer control line LTRF, the selecting control line LSEL, the discharge drain line LDRN, and the discharge gate line LDGT are driven by the vertical drive circuit 120.

The vertical drive circuit 120 controls the operation of pixels in a selected row in the pixel unit 110. The vertical drive circuit 120 controls the pixels 200 via the control lines LSEL, LRST, LTRF, LDRN, and LDGT.

The vertical drive circuit 120 carries out image driving control by switching the exposure mode to rolling shutter mode in which exposure is carried out on each row or to global shutter mode in which exposure is carried out simultaneously on all pixels.

FIG. 6 is a simplified sectional view illustrating one of the pixels 200 according to this embodiment. The pixel 200 includes the photoelectric conversion film 201, the contact unit 202, the barrier unit 203, the accumulation unit 204, the transfer transistor 205, the discharge transistor 209, the upper electrode 210, the lower electrode 211, and the contact 212.

Basically, in the pixel 200, the accumulation unit 204 having a p-layer 2041 and an n-layer 2042 jointed through a p-n junction is provided inside a p-well 221 of a Si semiconductor substrate 220 at the surface of the substrate.

An n+ diffusion layer 2051 of the transfer transistor 205 is provided on the right side (in the drawing) of the accumulation unit 204. A gate electrode 2054 is provided above a gate insulting film 2053, which is provided above a channel forming region 2052 interposed between the p-layer 2041 and n+ diffusion layer 2051 of the accumulation unit 204.

The right edge (in the drawing) of the contact unit 202, which is an n+ layer, is in contact with the p-layer 2041 of the accumulation unit 204.

The barrier unit 203 extends from the n-layer 2042 of the accumulation unit 204 along the bottom surface of the contact unit 202.

As described above, in the embodiment of FIG. 6, the contact unit 202 is the source region of the discharge transistor 209.

A drain region 2092 of the discharge transistor 209 and the contact unit 202 are provided on opposite ends of a channel forming region 2091. A gate electrode 2094 is provided above a gate insulating film 2093, which is disposed on the channel forming region 2091.

The drain region 2092 is connected to the discharge drain line LDRN via a contact 223 provided inside an inter-layer insulating film 222 disposed on the surface of the semiconductor substrate 220.

The lower electrode 211, the photoelectric conversion film 201, and the upper electrode 210 are stacked on the inter-layer insulating film 222 in this order from the bottom.

The upper electrode 210 is made of a transparent electrode, such as ITO.

The photoelectric conversion film 201 is made of amorphous silicon or an organic photoelectric conversion film.

The lower electrode 211 is made of a metal, such as Ti. The lower electrode 211 is connected through the contact to the contact unit (D) 202 at the surface of the silicon substrate 220.

As an organic photoelectric conversion film that carries out photoelectric conversion at a wavelength corresponding to green, organic photoelectric conversion materials, such as Rhodamine-based pigments, Merocyanine-based pigments, and quinacridone, may be used.

As an organic photoelectric conversion film that carries out photoelectric conversion at a wavelength corresponding to red, organic photoelectric conversion materials, such as phthalocyanine-based pigments, may be used.

As an organic photoelectric conversion film that carries out photoelectric conversion at a wavelength corresponding to blue, organic photoelectric conversion materials, such as coumarin-based pigments, tris(8-hydroxyquinolinato)aluminium (Alq3), and Merocyanine-based pigments, may be used.

Next, the operation of the pixel illustrated in FIGS. 5 and 6 will be described.

Figure 7:
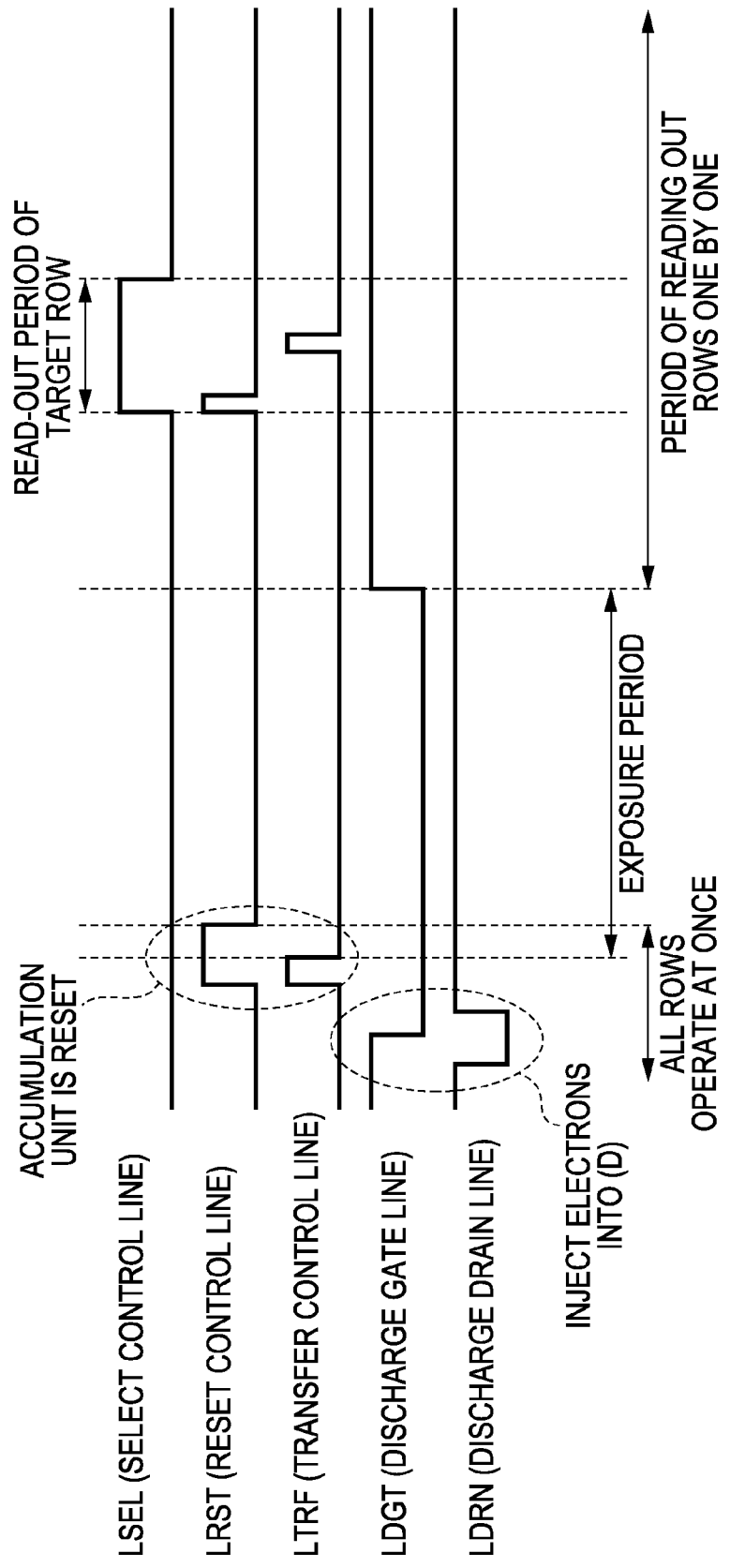
FIG. 7 is a timing chart illustrating the operation of the pixel illustrated in FIGS. 5 and 6.

FIG. 7 is a timing chart illustrating the operation of the pixel illustrated in FIGS. 5 and 6.

First, the discharge gate line LDGT and the discharge drain line LDRN of the discharge transistor 209 are driven to simultaneously inject electrons to the contact units (D) 202 of all pixels.

Then, high-active pulses are introduced to the transfer line TRF of the transfer transistor 205 and the reset control line LRST of the reset transistor 206 to reset the accumulation unit 204.

The period subsequent to the moment the transfer transistor 205 is turned off is the exposure period.

At the end of the exposure period, the discharge gate lines LDGT of all pixels are simultaneously returned to a high level.

The subsequent period is a period for reading out rows one at a time. The target pixel is read out in a normal manner when the corresponding row is read out.

Figure 8:
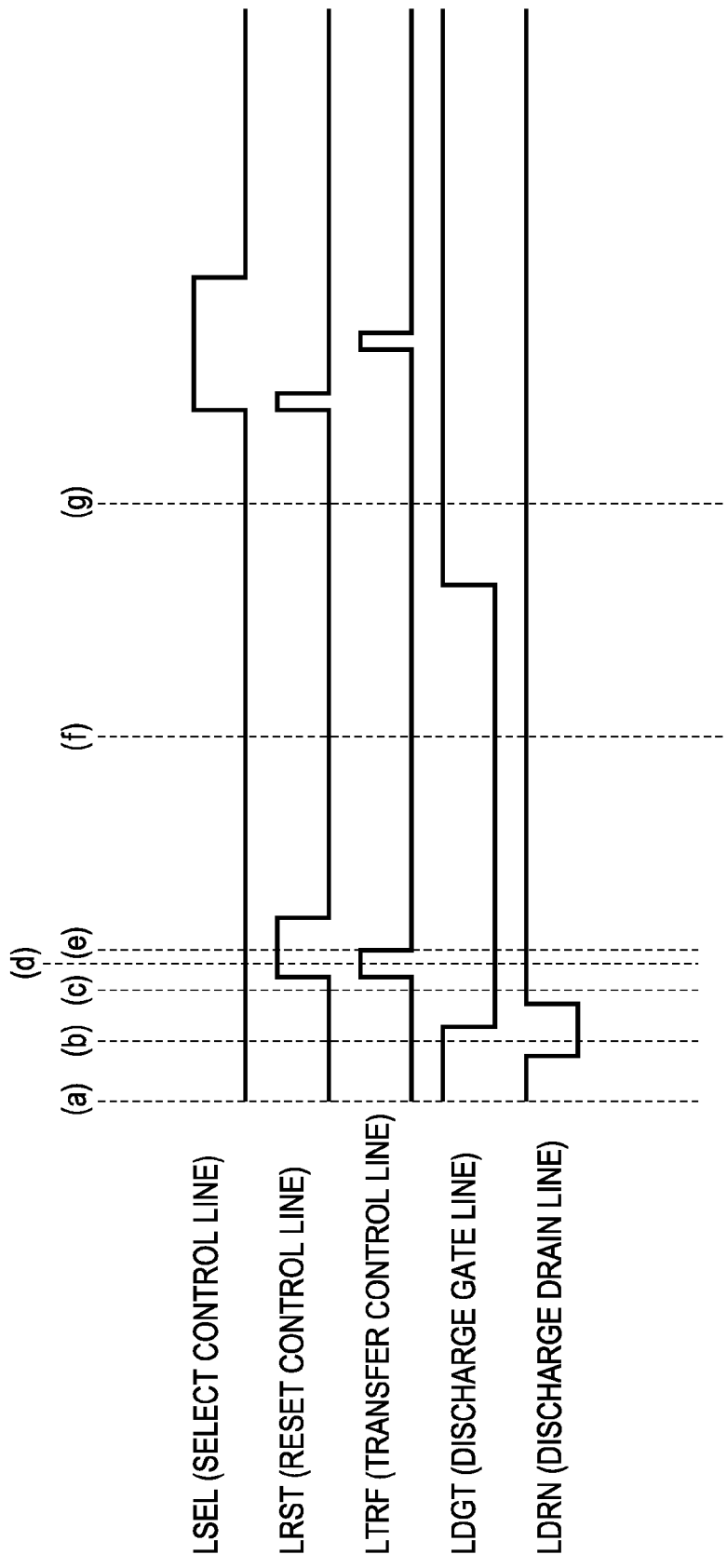
FIG. 8 is a first potential diagram illustrating operation timings of the pixel illustrated in FIGS. 5 and 6.
Figure 9:
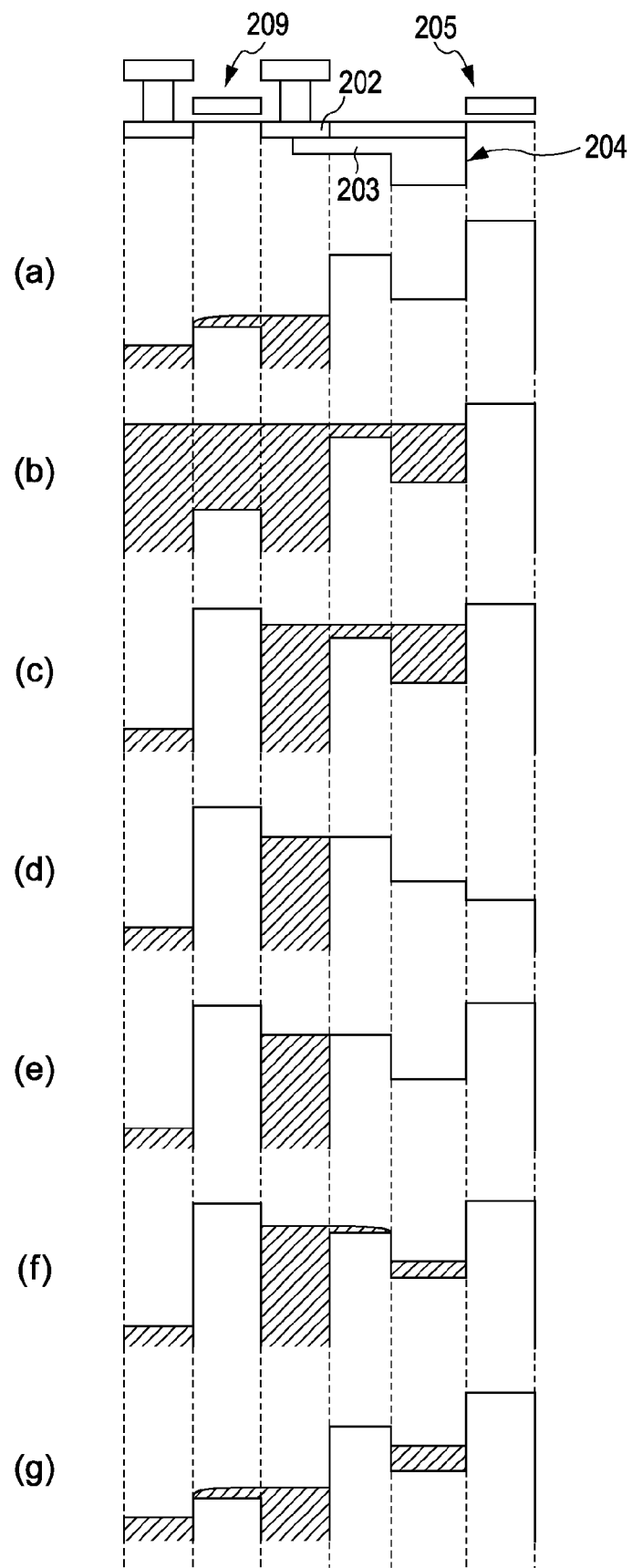
FIG. 9 is a second potential diagram illustrating operation timings of the pixel illustrated in FIGS. 5 and 6.

FIGS. 8 and 9 are potential diagrams corresponding to the operation timings illustrated in FIGS. 5 and 6, respectively.

(a) Photons from the photoelectric conversion film 201 are discarded at the drain (A) of the discharge transistor 209 from the contact unit (D) 202.

(b) The discharge drain line LDRN is set to a low level for initialization.

Electrons are injected from the discharge drain line LDRN to the accumulation unit 204 via the discharge transistor 209 and the barrier unit 203.

(c) After setting the discharge gate line LDGT to a low level, the discharge drain line LDRN is set to a high level.

At this time, the injected electrons remain in the contact unit (D) 202 and the accumulation unit 204.

(d) Upon turning on the transfer transistor 205 and the reset transistor 206 by driving the transfer line LTRF and a reset line LRST, the electrons in the accumulation unit 204 are removed to empty the accumulation unit 204, and the electric potential of the contact unit (D) 202 equals that of the barrier unit 203.

The drawings are illustrated up to the transfer gate.

(e) By setting the transfer control line LTRF to a low level, accumulation starts at the accumulation unit 204.

(f) While accumulation is taking place, the photons from the photoelectric conversion film 201 pass through the barrier unit 203 and are accumulated in the accumulation unit 204.

(g) Until the read-out turn of the pixel 200 in interest after the exposure period ends and the discharge transistor 209 is turned on, the signal is stored in the accumulation unit 204 and the photons from the photoelectric conversion film 201 are discharged through the discharge transistor 209.

Through the above-described operation, the photons from the photoelectric conversion film flow into the accumulation unit 204 from the beginning of the exposure period, and the linearity of the signal improves.

Figure 10:
FIG. 10 illustrates the operation concept of the pixel according to the first embodiment.

FIG. 10 schematically illustrates the operation.

At first, the substantive step of electrons being injected from the drain (A) of the discharge transistor 209 to the contact unit (D) 202 is carried out.

This is realized by driving the drain (A) of the discharge transistor 209. The vertical drive circuit 120 has a drive circuit of the discharge drain line LDRN.

3. Second Embodiment of Pixel

Figure 11:
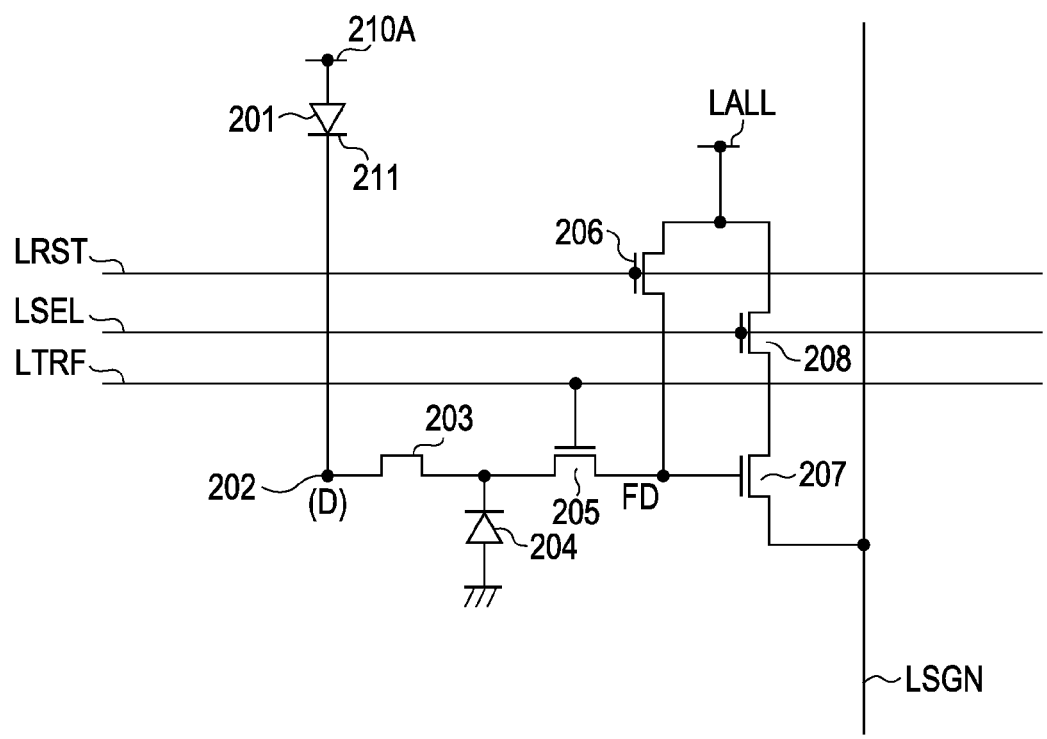
FIG. 11 is a circuit diagram illustrating a pixel according to a second embodiment.

FIG. 11 is a circuit diagram illustrating a pixel according to a second embodiment of the present invention.

Figure 12:
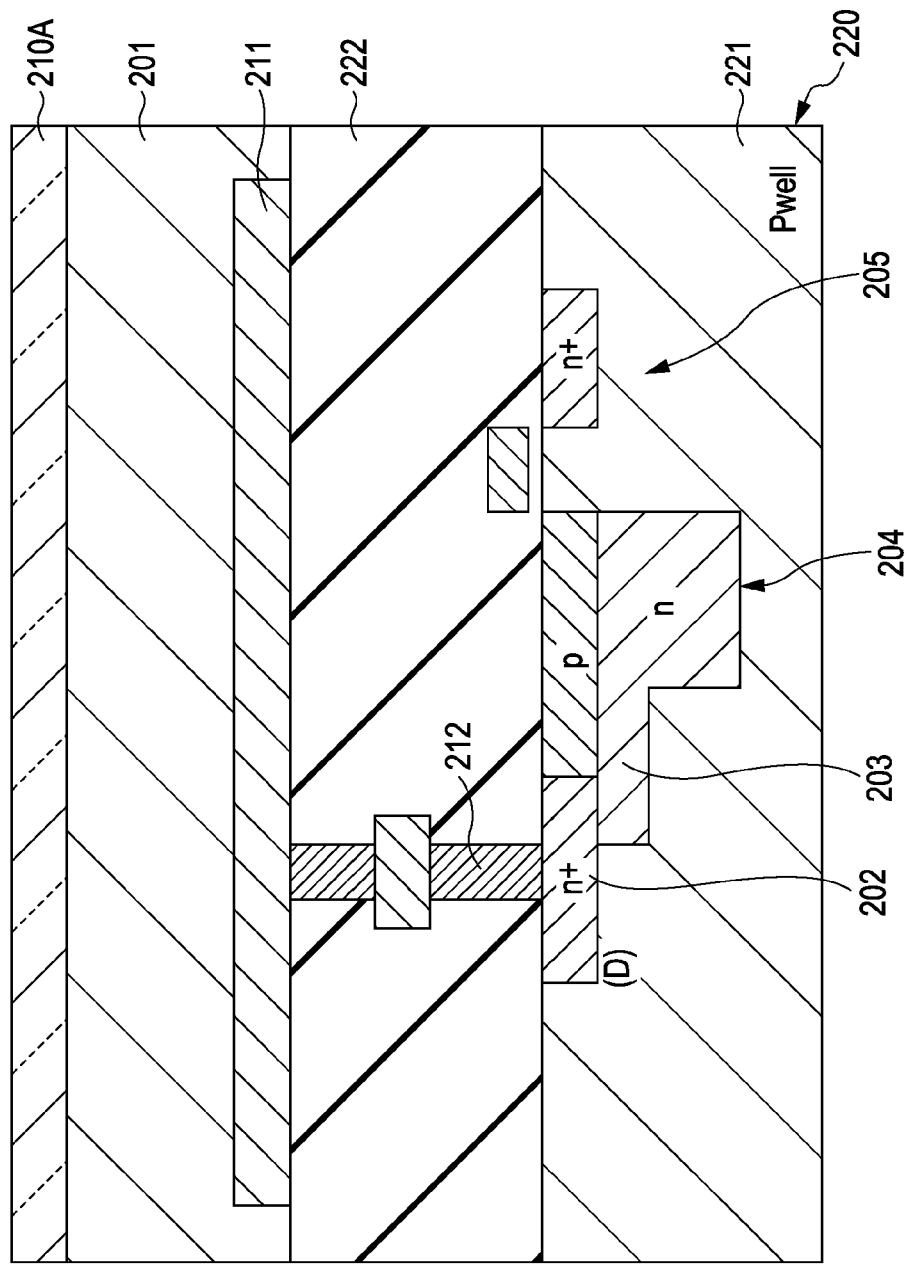
FIG. 12 is a simplified partial sectional view illustrating, in outline, the pixel according to the second embodiment of the present invention.

FIG. 12 is a simplified partial sectional view illustrating, in outline, the pixel according to the second embodiment.

A pixel 200A according to the second embodiment differs from the pixel 200 according to the first embodiment in that the pixel 200A does not include a discharge transistor.

The second embodiment includes a photoelectric conversion unit 201, which is a stack of a plurality of sensor layers. Each sensor layer may correspond to a certain wavelength range (e.g., color). For example, the photoelectric conversion unit 201 may include a red sensor layer, a green sensor layer, and a blue sensor layer. By stacking the photoelectric conversion films to provide a photoelectric conversion unit 201, operation in a global shutter mode is possible without a discharge transistor.

In such a case, the reset transistor 206 and the drain line of the selecting transistor 208 (which may instead by an amplifier transistor in some cases) are common lines for all pixels but can be driven without a fixed voltage.

An upper electrode 210A can also be driven without fixing the voltage.

The vertical drive circuit 120 drives a full-surface line LALL and the upper electrode 210A. As shown in FIG. 11, the full-surface line is a power supply line (e.g., voltage line). The full-surface line LALL crisscrosses interlayer insulating film 222. The full-surface line, as well as other wirings, are not shown in the simplified partial sectional view of FIG. 12.

Figure 13:
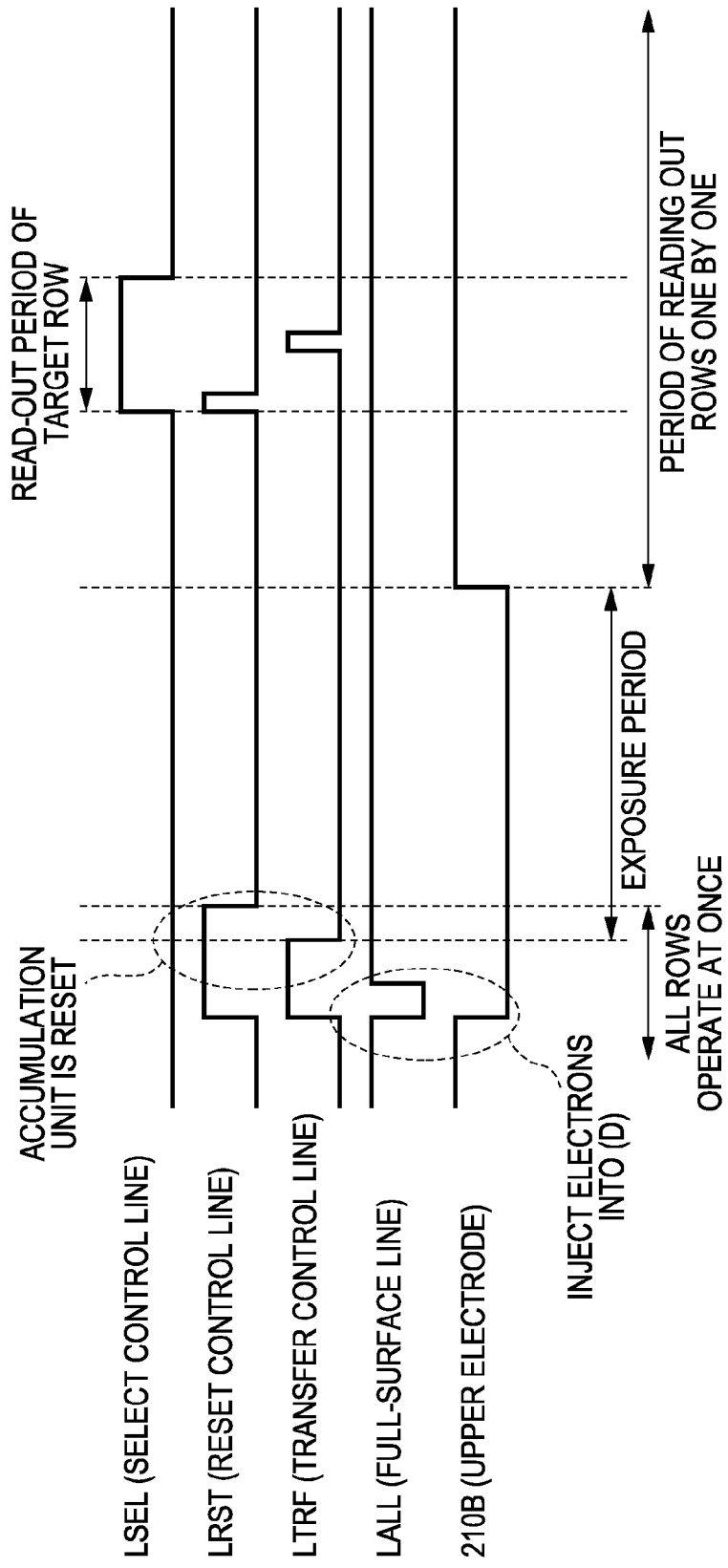
FIG. 13 is a timing chart illustrating the operation of the pixel illustrated in FIGS. 11 and 12.

FIG. 13 is a timing chart illustrating the operation of the pixel illustrated in FIGS. 11 and 12.

High-active pulses are introduced to the transfer line LTRF and the reset control line LRST to set the full-surface line LALL to a low level while the transfer transistor 205 and the reset transistor 206 are turned on.

In this way, electrons are injected into the contact unit (D) 202 via the reset transistor 206 and the transfer transistor 205.

By returning the full-surface line LALL to a high level, the electric potential of the contact unit (D) 202 equals that of the barrier unit 203, and the accumulation unit 204 is reset.

Since the upper electrode 210A is at a low level during the exposure period, the photons of the photoelectric conversion film 201 are sent to the Si side.

By setting to the upper electrode 210 to a high level when the exposure ends, the photons of the photoelectric conversion film 201 are prohibited from being sent to the Si side. Then, the rows are read out one at a time.

While the upper electrode 210A is at a high level, the electric potential of the contact unit (D) 202 is higher than that of the barrier unit 203, and this condition does not change even when the upper electrode 210A is returned to a low level. Therefore, without solving this problem, degradation in the linearity may occur due to the same mechanism.

To solve this problem, electrons are injected from the full-surface line LALL to the contact unit (D) 202, and the electrons in the accumulation unit 204 are subsequently discharged.

In principle, this is the same as in the first embodiment.

In this embodiment, by providing a photoelectric conversion film unit 201 as a stack of a plurality of sensor layers, signal mixing is prevented, without providing a discharge transistor, after exposure is ended in a global shutter mode.

4. Third Embodiment of Pixel

Figure 14:
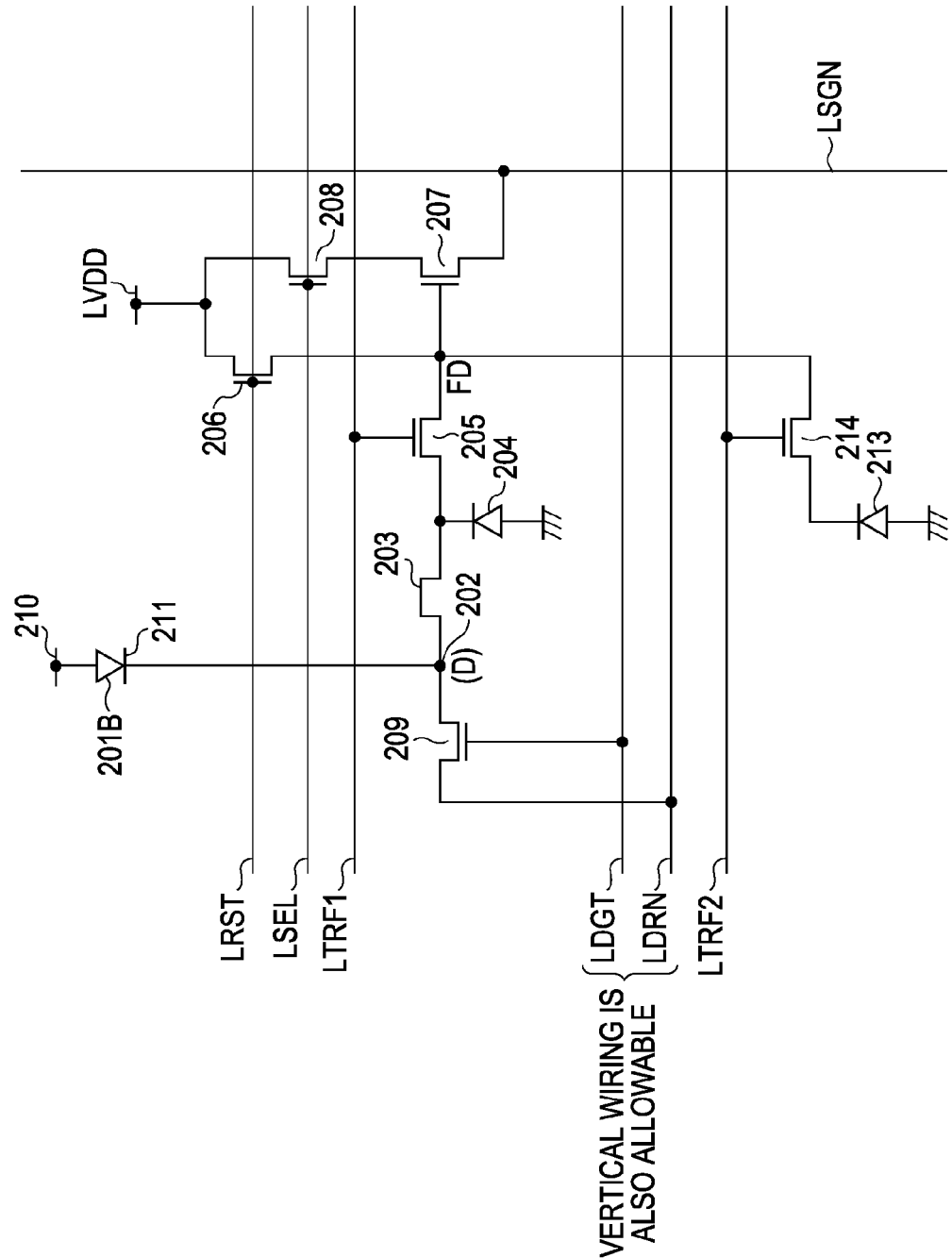
FIG. 14 is a circuit diagram illustrating a pixel according to a third embodiment.

FIG. 14 is a circuit diagram illustrating a pixel according to a third embodiment of the present invention.

Figure 15:
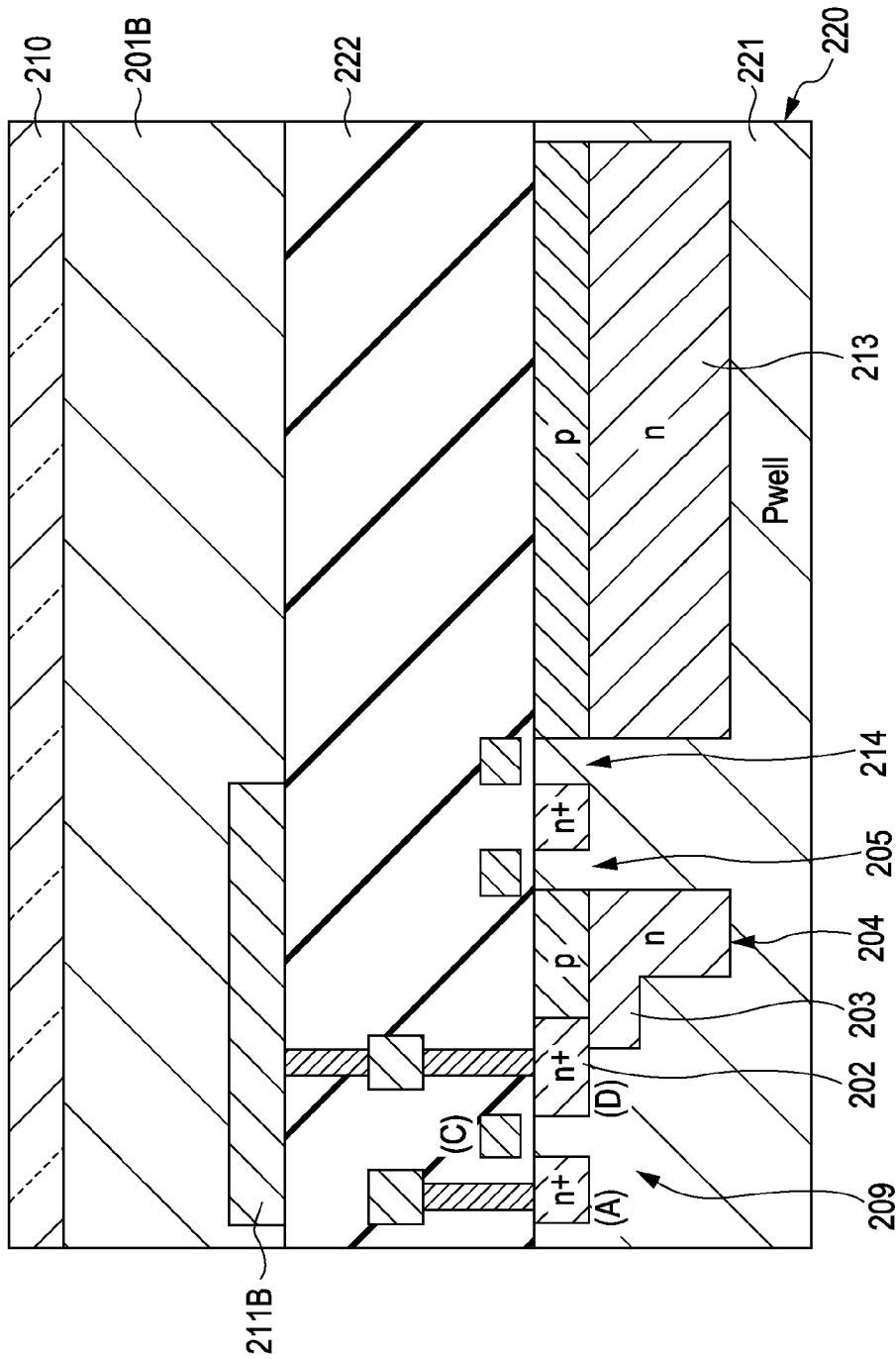
FIG. 15 is a simplified partial sectional view illustrating, in outline, the pixel according to the third embodiment of the present invention.

FIG. 15 is a simplified partial sectional view illustrating, in outline, the pixel according to the third embodiment of the present invention.

A pixel 200B of the third embodiment differs from the pixel 200 of the first embodiment in that the pixel 200B includes a combination of the photoelectric conversion film 201B and a photodiode 213.

A transfer transistor 214 is connected to the photodiode 213, the accumulation unit 204, and the floating diffusion FD (hereinafter may also simply be referred to as FD), which is an output node.

The transfer transistor 214 receives a transfer signal TRG2, which is a control signal to its gate (transfer gate), via a transfer control line LTRF2.

In this way, the transfer transistor 214 transfers the charge (in this case, electrons) accumulated in the photodiode 213 to the floating diffusion FD.

The combination of the photoelectric conversion film 201B, which absorbs light of a specific wavelength (e.g., green), and the photodiode 213, which is disposed on the Si semiconductor substrate 220 and absorbs the light transmitted through the photoelectric conversion film 201B, will be described.

FIG. 15 is a concept diagram of the pixel 200B. The photoelectric conversion film 201B is an organic photoelectric conversion film.

The photodiode 213 is disposed in the Si semiconductor substrate 220 and is constructed in the same manner as any typical photodiode.

Since the components are not actually aligned as in the drawing, FIG. 15 is more of a conceptual diagram than a sectional diagram.

Figure 16:
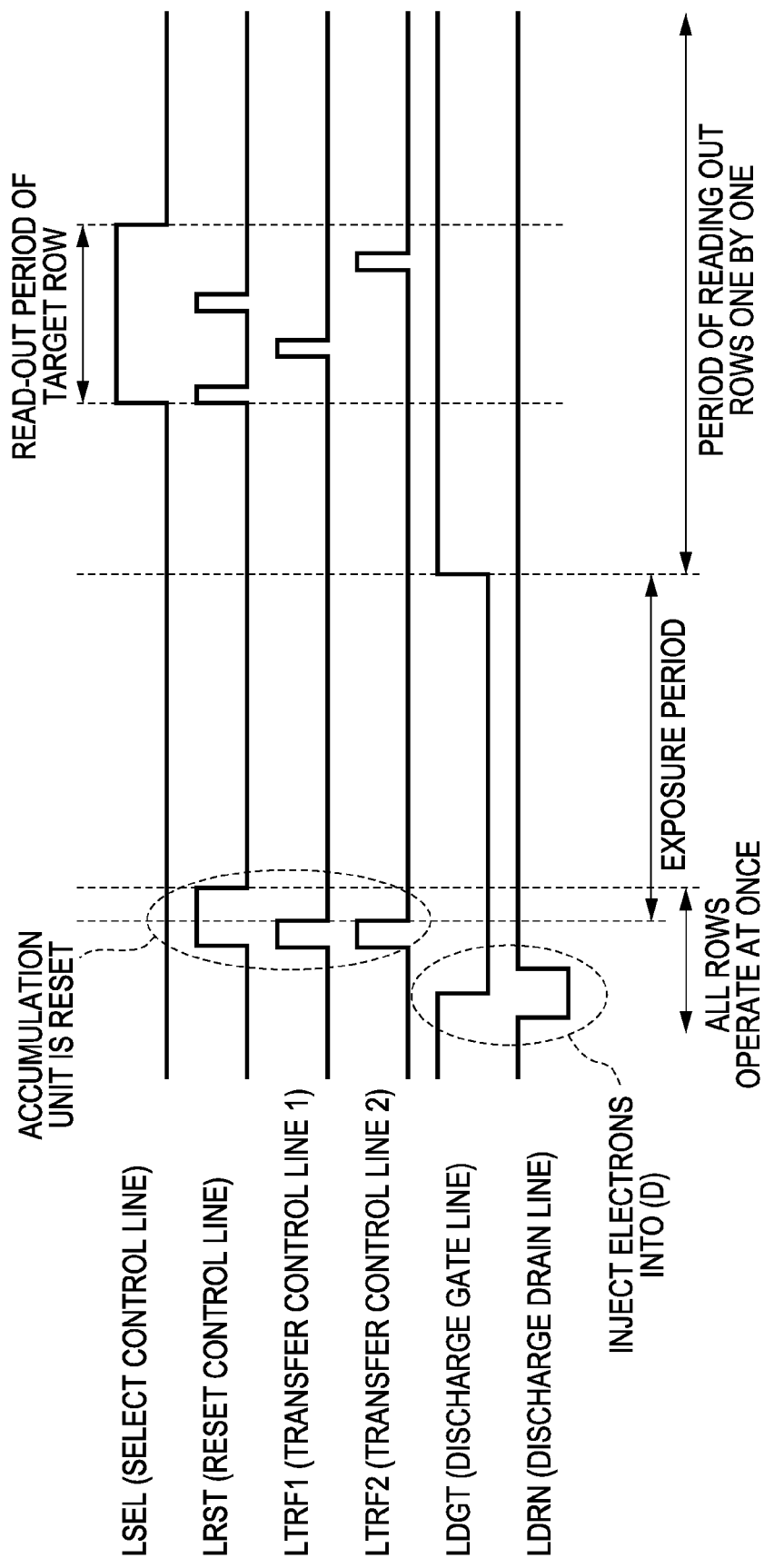
FIG. 16 is a timing chart illustrating the operation of the pixel illustrated in FIGS. 14 and 15.

FIG. 16 is a timing chart illustrating the operation of the pixel illustrated in FIGS. 14 and 15.

In this case, when a signal is read out, the signal from the photoelectric conversion film 201B is read out first, and the signal from the photodiode 213 is read out subsequently.

The other operations are the same as those described above; therefore, descriptions thereof are not repeated here.

As described above, as an organic photoelectric conversion film that carries out photoelectric conversion at a wavelength corresponding to green, organic photoelectric conversion materials, such as Rhodamine-based pigments, Merocyanine-based pigments, and quinacridone, can be used.

As an organic photoelectric conversion film that carries out photoelectric conversion at a wavelength corresponding to red, organic photoelectric conversion materials, such as phthalocyanine-based pigments, can be used.

As an organic photoelectric conversion film that carries out photoelectric conversion at a wavelength corresponding to blue, organic photoelectric conversion materials, such as coumarin-based pigments, tris(8-hydroxyquinolinato)aluminium (Alq3), and Merocyanine-based pigments, can be used.

As described above, according to this embodiment, the linearity of a signal when a MOS-type solid-state imaging apparatus having a photoelectric conversion film is operated in a global shutter mode can be improved.

A solid-state imaging apparatus having these characteristics can be applied to imaging devices in digital cameras and video cameras.

Figure 17:
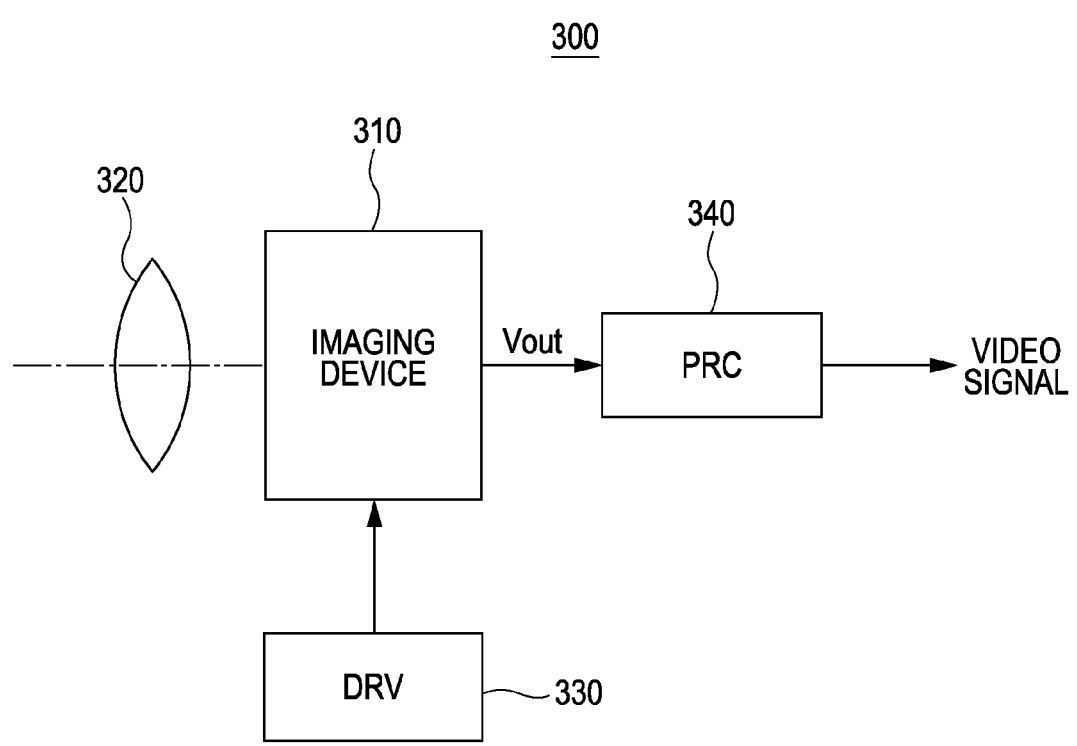
FIG. 17 illustrates an example configuration of a camera system to which a solid-state imaging apparatus according to an embodiment of the present invention is applied.

FIG. 17 illustrates an example configuration of a camera system to which a solid-state imaging apparatus according to an embodiment of the present invention is applied.

5. Camera

As illustrated in FIG. 17, a camera system 300 includes an imaging device 310 to which the solid-state imaging apparatus 100 according to an embodiment of the present invention can be applied.

The camera system 300 includes an optical system that forms an image of a subject by guiding incident light to a pixel region in the imaging device 310, e.g., a lens 320 forming an image of the incident light (image light) on an imaging surface.

The camera system 300 includes a drive circuit (DRV) 330 that drives the imaging device 310 and a signal processing circuit (PRC) 340 that processes output signals from the imaging device 310.

The drive circuit 330 includes a timing generator (not shown) that generates various timing signals including start pulses and clock pulses for driving circuits in the imaging device 310.

The signal processing circuit 340 carries out signal processing, such as correlated double sampling (CDS), on the output signal from the imaging device 310.

The image signals processed at the signal processing circuit 340 are recorded in a recording medium, such as a memory.

Image information recorded on the recording medium can be output as a hardcopy by a printer or the like. The image signals processed at the signal processing circuit 340 can be displayed as a moving image on a monitor including, for example, a liquid crystal display.

As described above, in an imaging device, such as a digital still camera, by including the above-described solid-state imaging apparatus 100 as the imaging device 310, a camera with high precision is realized.

The present invention is not limited to the embodiments described above.

For example, the values and materials mentioned in the embodiments are merely examples and are not limited thereto.

Various modifications are possible within the scope of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising: a pixel unit including a matrix of pixels converting light to an electric signal; and a driving unit driving the pixel unit, wherein each of the pixels includes a photoelectric conversion film carrying out photoelectric conversion, an injection unit injecting a charge generated at the photoelectric conversion film to a contact unit embedded in a semiconductor substrate, an accumulation unit having a p-type region and an n-type region and accumulating the charge generated at the photoelectric conversion film and being disposed in the semiconductor substrate such that the n-type region of the accumulation unit is located below both the p-type region of the accumulation unit and the contact unit in the semiconductor substrate, and a barrier unit providing an electric potential barrier between the photoelectric conversion film and the accumulation unit, wherein a side edge of the contact unit is in contact with the accumulation unit such that an entire top surface of the barrier unit is only in contact with a bottom surface of the accumulation unit and a bottom surface of the contact unit, and wherein the pixel unit selectively injects the charge to the injection unit of the pixel.

2. The solid-state imaging apparatus according to claim 1, further comprising: a discharge transistor having a source connected to the injection unit, wherein the driving unit controls a drain voltage of the discharge transistor to inject a charge into the injection unit.

3. The solid-state imaging apparatus according to claim 2, further comprising: a reset transistor being connected to both the accumulation unit and an electric potential line and resetting the charge in the accumulation unit, wherein the driving unit resets the charge in the accumulation unit after injecting a charge into the injection unit.

4. The solid-state imaging apparatus according to claim 2, further comprising: a reset transistor being connected to both the accumulation unit and an electric potential line and resetting the charge in the accumulation unit, wherein the driving unit injects a charge from the drain of the discharge transistor to the accumulation unit via the injection unit, and wherein, after the injection, the charge in the accumulation unit is reset.

5. The solid-state imaging apparatus according to claim 2, wherein photons from the photoelectric conversion are discarded at a drain of the discharge transistor, the source of the discharge transistor being connected to the injection unit to selectively inject the charge.

6. The solid-state imaging apparatus according to claim 1, further comprising: a reset transistor being connected to both the accumulation unit and an electric potential line and resetting the charge in the accumulation unit, wherein the driving unit injects a charge from the electric potential line of the reset transistor to the injection unit via the accumulation unit.

7. The solid-state imaging apparatus according to claim 6, wherein the driving unit resets the charge in the accumulation unit after injecting a charge into the injection unit.

8. A method of driving a solid-state imaging apparatus including a pixel unit including a matrix of pixels converting light to an electric signal, and a driving unit driving the pixel unit, wherein each of the pixels includes a photoelectric conversion film carrying out photoelectric conversion, an injection unit injecting a charge generated at the photoelectric conversion film to a contact unit embedded in a semiconductor substrate, an accumulation unit having a p-type region and an n-type region and accumulating the charge generated at the photoelectric conversion film and being disposed in the semiconductor substrate such that the n-type region of the accumulation unit is located below both the p-type region of the accumulation unit and the contact unit in the semiconductor substrate, and a barrier unit providing an electric potential barrier between the photoelectric conversion film and the accumulation unit, wherein a side edge of the contact unit is in contact with the accumulation unit such that an entire top surface of the barrier unit is only in contact with a bottom surface of the accumulation unit and a bottom surface of the contact unit, and wherein the pixel unit selectively injects a charge to the injection unit of the pixel, the method comprising the step of: selectively injecting a charge to the injection unit of each of the pixels.

9. The method of driving a solid-state imaging apparatus according to claim 8, further comprising the step of: injecting a charge to the injection unit by controlling a drain voltage of a discharge transistor having a source connected to the injection unit.

10. The method of driving a solid-state imaging apparatus according to claim 9, further comprising the step of: resetting the charge in the accumulation unit by a reset transistor connected to both the accumulation unit and an electric potential line after a charge is injected into the injecting unit.

11. The method of driving a solid-state imaging apparatus according to claim 9, further comprising the step of: resetting the accumulation unit by a reset transistor connected to both the accumulation unit and an electric potential line after a charge is injected from a drain of the discharge transistor to the accumulation unit via the injection unit.

12. The method of driving a solid-state imaging apparatus according to claim 8, further comprising the step of: injecting a charge from an electric potential line of a rest transistor, which is connected to both the accumulation unit and an electric potential line, to the injection unit via the accumulation unit.

13. The method of driving a solid-state imaging apparatus according to claim 12, further comprising the step of: resetting the charge in the accumulation unit after a charge is injected into the injection unit.

14. A camera comprising: a solid-state imaging apparatus configured to receive light from a first substrate surface of a substrate; an optical system configured to guide incident light to the first substrate surface of the solid-state imaging apparatus; and a signal processing circuit configured to process an output signal from the solid-state imaging apparatus, wherein the solid-state imaging apparatus includes a pixel unit including a matrix of pixels converting light to an electric signal, and a driving unit driving the pixel unit, wherein each of the pixels includes a photoelectric conversion film carrying out photoelectric conversion, an injection unit injecting a charge generated at the photoelectric conversion film into a contact unit embedded in a semiconductor substrate, an accumulation unit having a p-type region and an n-type region and accumulating the charge generated at the photoelectric conversion film and being disposed in the semiconductor substrate such that the n-type region of the accumulation unit is located below both the p-type region of the accumulation unit and the contact unit in the semiconductor substrate, and a barrier unit providing an electric potential barrier between the photoelectric conversion film and the accumulation unit, wherein a side edge of the contact unit is in contact with the accumulation unit such that an entire top surface of the barrier unit is only in contact with a bottom surface of the accumulation unit and a bottom surface of the contact unit and wherein the pixel unit selectively injects a charge into the injection unit of the pixel.

15. An imaging device comprising: a photoelectric conversion unit; a contact region to receive a charge from the photoelectric conversion unit; an accumulation region to store the charge; and a barrier region via which the charge passes from the contact region to the accumulation region; wherein, the device is configured to selectively inject a charge into the contact region through the barrier region to the accumulation region, wherein a side edge of the contact region is in contact with the accumulation region such that an entire top surface of the barrier region is only in contact with a bottom surface of the accumulation region and a bottom surface of the contact region.

16. The imaging device of claim 15, wherein the contact region receives the charge, and the accumulation region is reset prior to a corresponding exposure period.

17. The imaging device of claim 15, wherein the photoelectric conversion unit comprises a stack that includes a plurality of sensor layers, each of the plurality of sensor layers corresponding to a different color.

18. The imaging device of claim 15, further comprising: a photodiode to absorb light transmitted through the photoelectric conversion unit, wherein, a signal from the photoelectric conversion unit is configured to be read before a signal from the photodiode is read.

19. An electronic apparatus comprising: an optical system; and an imaging device to receive incident light from the optical system, said imaging device having a plurality of pixels, each pixel including (a) a photoelectric conversion unit, (b) a contact region to receive a charge from the photoelectric conversion unit, (c) an accumulation region to store the charge, wherein the accumulation region has a p-type region and an n-type region wherein the n-type region of the accumulation region is located below both the p-type region of the accumulation region and the contact region and (d) a barrier region, wherein a side edge of the contact region is in contact with the accumulation region such that an entire top surface of the barrier region is only in contact with a bottom surface of the accumulation region and a bottom surface of the contact region, and wherein the charge passes via the barrier region from the contact region to the accumulation region; and a circuit to control the imaging device such that a charge is selectively injected into the contact region.

20. The electronic apparatus of claim 19, wherein the circuit is configured to selectively inject the charge into the contact region, and start an operation to reset the accumulation region prior to an exposure period.

21. The electronic apparatus of claim 19, wherein the photoelectric conversion unit comprises a stack that includes a plurality of sensor layers, each of the plurality of sensor layers corresponding to a different color.

22. The electronic apparatus of claim 19, further comprising: a photodiode to absorb light transmitted through the photoelectric conversion unit, wherein, said circuit is configured to read a signal from the photoelectric conversion unit prior to reading a signal from the photodiode.

23. A method for driving an imaging device having a pixel, the pixel including (a) a photoelectric conversion unit, (b) a contact region to receive a charge from the photoelectric conversion unit, (c) an accumulation region to store the charge, wherein the accumulation region has a p-type region and an n-type region wherein the n-type region of the accumulation region is located below both the p-type region of the accumulation region and the contact region and (d) a barrier region, wherein a side edge of the contact region is in contact with the accumulation region such that an entire top surface of the barrier region is only in contact with a bottom surface of the accumulation region and a bottom surface of the contact region, and wherein the charge passes via the barrier region from the contact region to the accumulation region, said method comprising: controlling the imaging device by selectively injecting a charge into the contact region.

24. The method of claim 23, wherein said controlling of the imaging device includes: injecting the charge into the contact region, and starting a reset operation to reset the accumulation region prior to an exposure period.

25. The method of claim 24, wherein the injection of electrons includes: setting a full surface line to a low level while turning on a transfer transistor and a reset transistor such that the charge is injected from the full surface line to the contact region.

26. The method of claim 25, wherein the accumulation region is reset by returning the full surface line to a high level.

27. The method of claim 24, wherein the injection of electrons includes: setting an upper electrode of the imaging device to a low level while turning on a transfer transistor and a reset transistor to inject the charge into the contact region.

28. The method of claim 24, wherein the imaging device includes a discharge transistor connected to the contact region, and the injection of the charge includes: setting a discharge drain line of the discharge transistor to a low level.

29. The method of claim 28, further comprising:
turning on the discharge transistor and ending the exposure period; and reading out a row of pixels subsequent to the exposure period.

30. The method of claim 23, wherein the imaging device includes a photodiode to absorb light transmitted through the photoelectric conversion unit, and said method further comprises: reading a signal from the photoelectric conversion unit; and reading a signal from the photodiode.

31. The method of claim 30, wherein the signal from the photoelectric conversion unit is read prior to the signal from the photodiode.

* * * * *